United States Patent
Zhang et al.

(10) Patent No.: US 11,589,479 B1
(45) Date of Patent: Feb. 21, 2023

(54) HEAT-REJECTING MEDIA FOR USE IN DUAL-PRINTED CIRCUIT BOARD DEVICE

(71) Applicant: Dell Products L.P., Round Rock, TX (US)

(72) Inventors: Mingming Zhang, Shanghai (CN); Zhaobo Li, Shanghai (CN); Zhaowei Shang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/487,398

(22) Filed: Sep. 28, 2021

(30) Foreign Application Priority Data

Sep. 14, 2021 (CN) .......................... 202111077243.1

(51) Int. Cl.
*H05K 7/20* (2006.01)
*H05K 1/14* (2006.01)
(Continued)

(52) U.S. Cl.
CPC ........... *H05K 7/2039* (2013.01); *G06F 1/206* (2013.01); *H05K 1/0203* (2013.01);
(Continued)

(58) Field of Classification Search
CPC ......... G06F 1/20; G06F 1/206; H01L 23/427; H01L 23/373; H01L 23/3737; H01L 23/34; H01L 23/36; H01L 23/3672; H01L 51/529; F28D 15/02; F28D 15/0233; F28F 13/00; F28F 2013/006; F28F 21/02; F28F 21/00; F28F 3/00; F28F 2280/00; H05K 1/0203; H05K 7/20336; H05K 7/2039; H05K 7/20481; H05K 1/0201; H05K 1/0209; H05K 2201/10416; H05K 3/4697; H05K 7/20963; H05K 7/20472; H05K 7/20454; H05K 1/0277; H05K 1/14; H05K 2201/066; B32B 27/065; H01M 10/6554
See application file for complete search history.

(56) References Cited

U.S. PATENT DOCUMENTS 4,203,488 A * 5/1980 Johnson .............. H01L 23/4093
                                            174/16.3
6,131,651 A * 10/2000 Richey, III .......... H01L 23/3733
                                            257/E23.101
(Continued)

*Primary Examiner* — Michael A Matey
(74) *Attorney, Agent, or Firm* — Jackson Walker L.L.P.

(57) ABSTRACT

Heat-rejecting media configured to thermally couple to a heat-generating component of an information handling resource may include a source, a sink, and a thermally-conductive strip coupled between the source and the sink. The source may include a first flexible and thermally-conductive skin surrounding a first cavity comprising a first solid foam, such that mechanical compression by components of the information handling resource provides mechanical pressure for thermally coupling the source to the heat-generating component. The sink may include a second flexible and thermally-conductive skin surrounding a second cavity comprising a second solid foam, such that mechanical compression by components of the information handling resource provides mechanical pressure for thermally coupling the sink to a component of the information handling resource exposed externally to the information handling resource.

18 Claims, 6 Drawing Sheets

(51) Int. Cl.
    *H05K 1/02*           (2006.01)
    *G06F 1/20*           (2006.01)

(52) U.S. Cl.
    CPC ............ *H05K 1/0277* (2013.01); *H05K 1/14* (2013.01); *H05K 2201/066* (2013.01)

(56) References Cited

U.S. PATENT DOCUMENTS

| | | | |
|---|---|---|---|
| 9,332,627 B2* | 5/2016 | Hung | H01L 23/367 |
| 9,405,335 B1* | 8/2016 | Boilard | G06F 1/203 |
| 11,109,513 B2* | 8/2021 | Kawamura | B32B 1/04 |
| 2005/0180113 A1* | 8/2005 | Shirakami | F28D 15/0233 |
| | | | 257/E23.09 |
| 2008/0225484 A1* | 9/2008 | Brodsky | H01L 23/433 |
| | | | 165/80.4 |
| 2011/0100608 A1* | 5/2011 | Huang | F28D 15/0233 |
| | | | 165/104.26 |
| 2014/0332193 A1* | 11/2014 | Oh | F28F 21/06 |
| | | | 165/185 |
| 2015/0062802 A1* | 3/2015 | Grunow | H01L 23/34 |
| | | | 361/679.52 |
| 2015/0301568 A1* | 10/2015 | Hill | G06F 1/20 |
| | | | 29/890.03 |
| 2017/0231110 A1* | 8/2017 | Heiberg | H05K 9/0022 |
| 2018/0033571 A1* | 2/2018 | Choi | H04M 1/0266 |
| 2019/0041922 A1* | 2/2019 | Kurma Raju | G06F 1/1637 |
| 2019/0318978 A1* | 10/2019 | Cho | H01L 35/30 |
| 2020/0058968 A1* | 2/2020 | Thompson | G06F 1/206 |

\* cited by examiner

HEAT-REJECTING MEDIA FOR USE IN DUAL-PRINTED CIRCUIT BOARD DEVICE

TECHNICAL FIELD

The present disclosure relates in general to information handling systems, and more particularly to cooling of information handling system components using heat-rejecting media, in particular a thermally-conductive medium for use in a device comprising a dual printed circuit board, such as a solid state drive.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

However, for some components of an information handling system, air cooling may be impossible or impractical. For example, many solid state drives (SSDs) used for storing data are implemented using a dual-printed circuit board (PCB) rigid-flex design, with a power management integrated circuit (PMIC) placed between the two PCBs which may provide electrical energy to various components of the SSD. A PMIC may generate significant heat during operation, and due to the limited space (e.g., approximately 2 millimeters) between the two PCBs, it may not be feasible to thermally couple a traditional heatsink to the PMIC to allow for efficient air cooling of the PMIC.

SUMMARY

In accordance with the teachings of the present disclosure, the disadvantages and problems associated with thermal control of information handling resources may be substantially reduced or eliminated.

In accordance with embodiments of the present disclosure, an information handling system may include a processor and an information handling resource communicatively coupled to the processor, the information handling resource comprising a heat-generating component and heat-rejecting media thermally coupled to the information handling resource, the heat-rejecting media comprising a source, a sink, and a thermally-conductive strip coupled between the source and the sink. The source may include a first flexible and thermally-conductive skin surrounding a first cavity comprising a first solid foam, such that mechanical compression by components of the information handling resource provides mechanical pressure for thermally coupling the source to the heat-generating component. The sink may include a second flexible and thermally-conductive skin surrounding a second cavity comprising a second solid foam, such that mechanical compression by components of the information handling resource provides mechanical pressure for thermally coupling the sink to a component of the information handling resource exposed externally to the information handling resource.

In accordance with these and other embodiments of the present disclosure, heat-rejecting media configured to thermally couple to a heat-generating component of an information handling resource may include a source, a sink, and a thermally-conductive strip coupled between the source and the sink. The source may include a first flexible and thermally-conductive skin surrounding a first cavity comprising a first solid foam, such that mechanical compression by components of the information handling resource provides mechanical pressure for thermally coupling the source to the heat-generating component. The sink may include a second flexible and thermally-conductive skin surrounding a second cavity comprising a second solid foam, such that mechanical compression by components of the information handling resource provides mechanical pressure for thermally coupling the sink to a component of the information handling resource exposed externally to the information handling resource.

In accordance with these and other embodiments of the present disclosure, an information handling resource may include a heat-generating component and heat-rejecting media thermally coupled to the information handling resource, the heat-rejecting media comprising a source, a sink, and a thermally-conductive strip coupled between the source and the sink. The source may include a first flexible and thermally-conductive skin surrounding a first cavity comprising a first solid foam, such that mechanical compression by components of the information handling resource provides mechanical pressure for thermally coupling the source to the heat-generating component. The sink may include a second flexible and thermally-conductive skin surrounding a second cavity comprising a second solid foam, such that mechanical compression by components of the information handling resource provides mechanical pressure for thermally coupling the sink to a component of the information handling resource exposed externally to the information handling resource.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
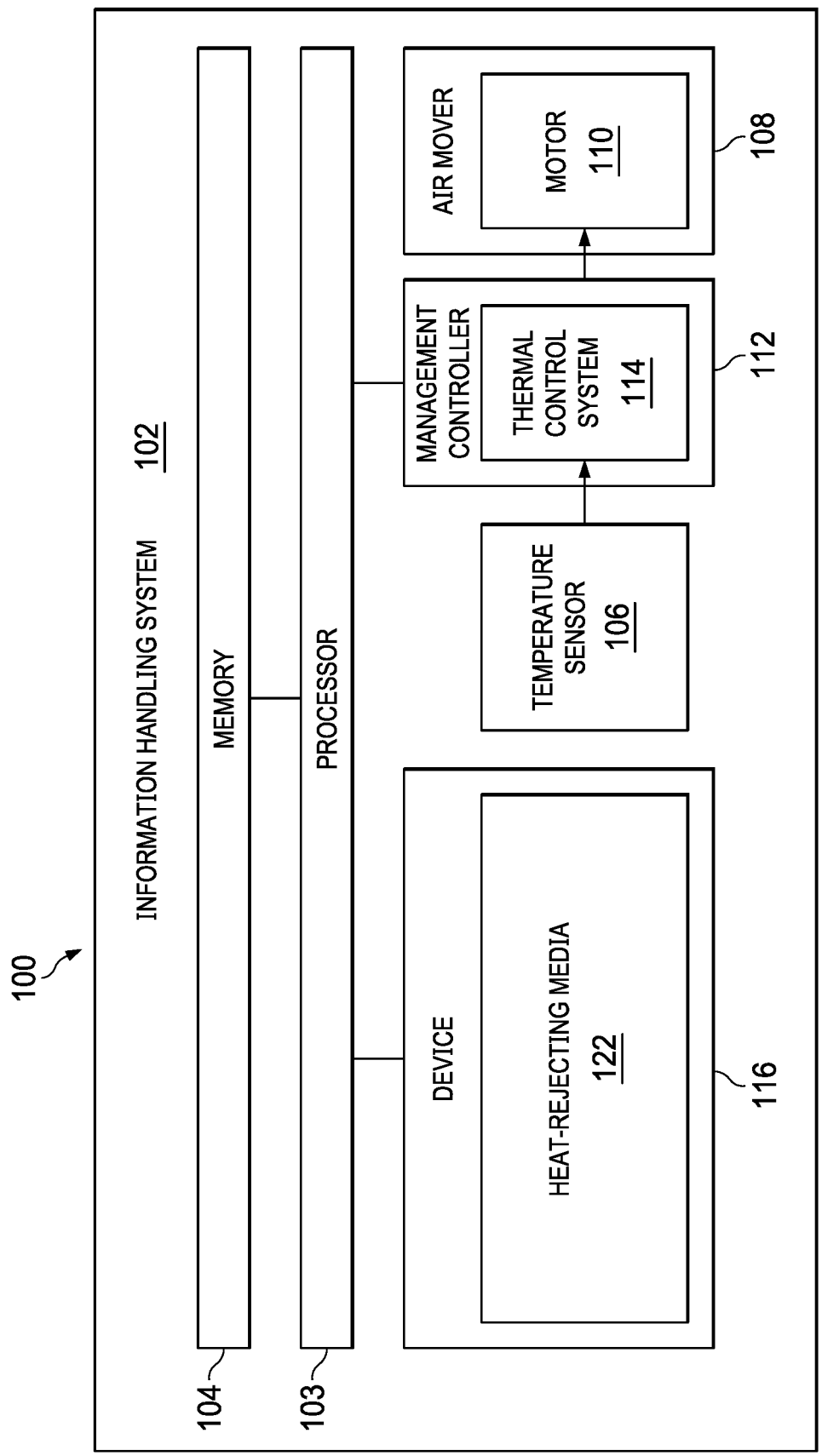
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, an air mover 108, a management controller 112, a device 116, and heat-rejecting media 122.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal communicated from thermal control system 114 of management controller 112. In operation, air mover 108 may cool information handling resources of information handling system 102 by drawing cool air into an enclosure housing the information handling resources from outside the chassis, expelling warm air from inside the enclosure to the outside of such enclosure, and/or moving air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirements information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to management controller 112 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages, electro-mechanical devices, displays, and power supplies. In particular embodiments, device 116 may comprise an SSD having a PMIC.

As shown in FIG. 1, device 116 may have mechanically and thermally coupled thereto heat-rejecting media 122. Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid member thermally coupled to the information handling resource (e.g., heat spreader) such that heat generated by the information handling resource is transferred from the information handling resource into air surrounding the information handling resource. For example, in the embodiments represented by FIG. 1, heat-rejecting media 122 may be thermally coupled to device 116 and arranged such that heat generated by device 116 is transferred to air driven by air mover 108, as described in greater detail below.

In addition to processor 103, memory 104, temperature sensor 106, air mover 108, management controller 112, device 116, and heat-rejecting media 122, information handling system 102 may include one or more other information handling resources. In addition, for the sake of clarity and exposition of the present disclosure, FIG. 1 depicts only one air mover 108 and one device 116. In embodiments of the present disclosure, information handling system 102 may include any number of air movers 108 and devices 116. However, in some embodiments, approaches similar or identical to those used to cool device 116 as described herein may be employed to provide cooling of processor 103, memory 104, management controller 112, and/or any other information handling resource of information handling system 102.

Figure 2:
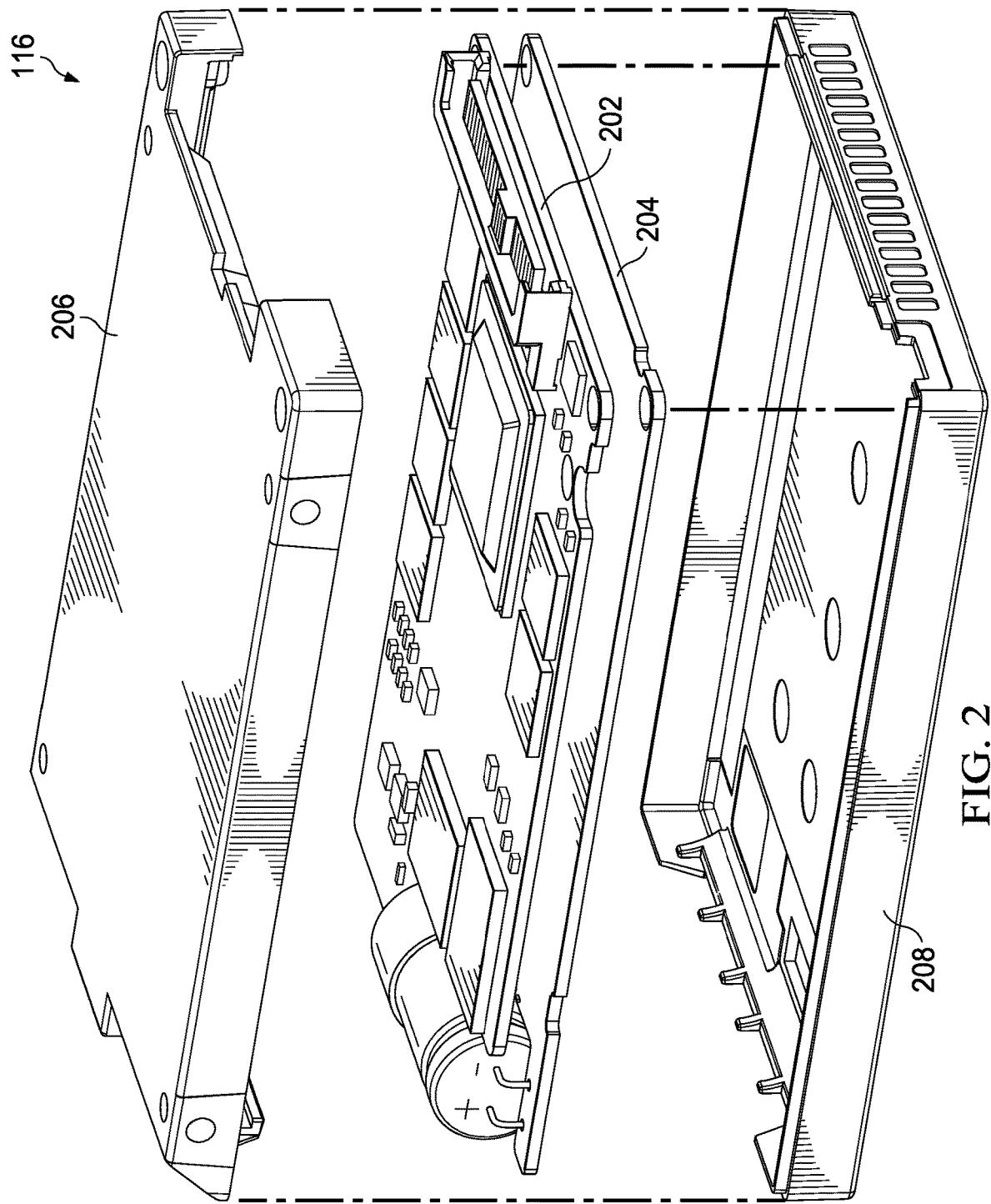
FIG. 2 illustrates an exploded isometric perspective view of an example device, in accordance with embodiments of the present disclosure.

FIG. 2 illustrates an exploded isometric perspective view of an example device 116, in accordance with embodiments of the present disclosure. For purposes of clarity and exposition, heat-rejecting media 122 is not depicted in FIG. 2. As shown in FIG. 2, device 116 may be implemented in a dual-PCB design comprising a top PCB 202 and a bottom PCB 204. Further, top PCB 202 and bottom PCB 204 may be enclosed by an enclosure comprising a top cover 206 and a bottom cover 208. In some embodiments, one or both of top cover 206 and bottom cover 208 may be constructed from metal or another thermally-conductive material. In some embodiments, device 116 may comprise an SSD.

In the foregoing paragraph (and throughout this disclosure), the use of the terms "top" and "bottom" are arbitrary and used for purposes of exposition, and not meant to require a particular position of device 116 within information handling system 102.

Figure 3:
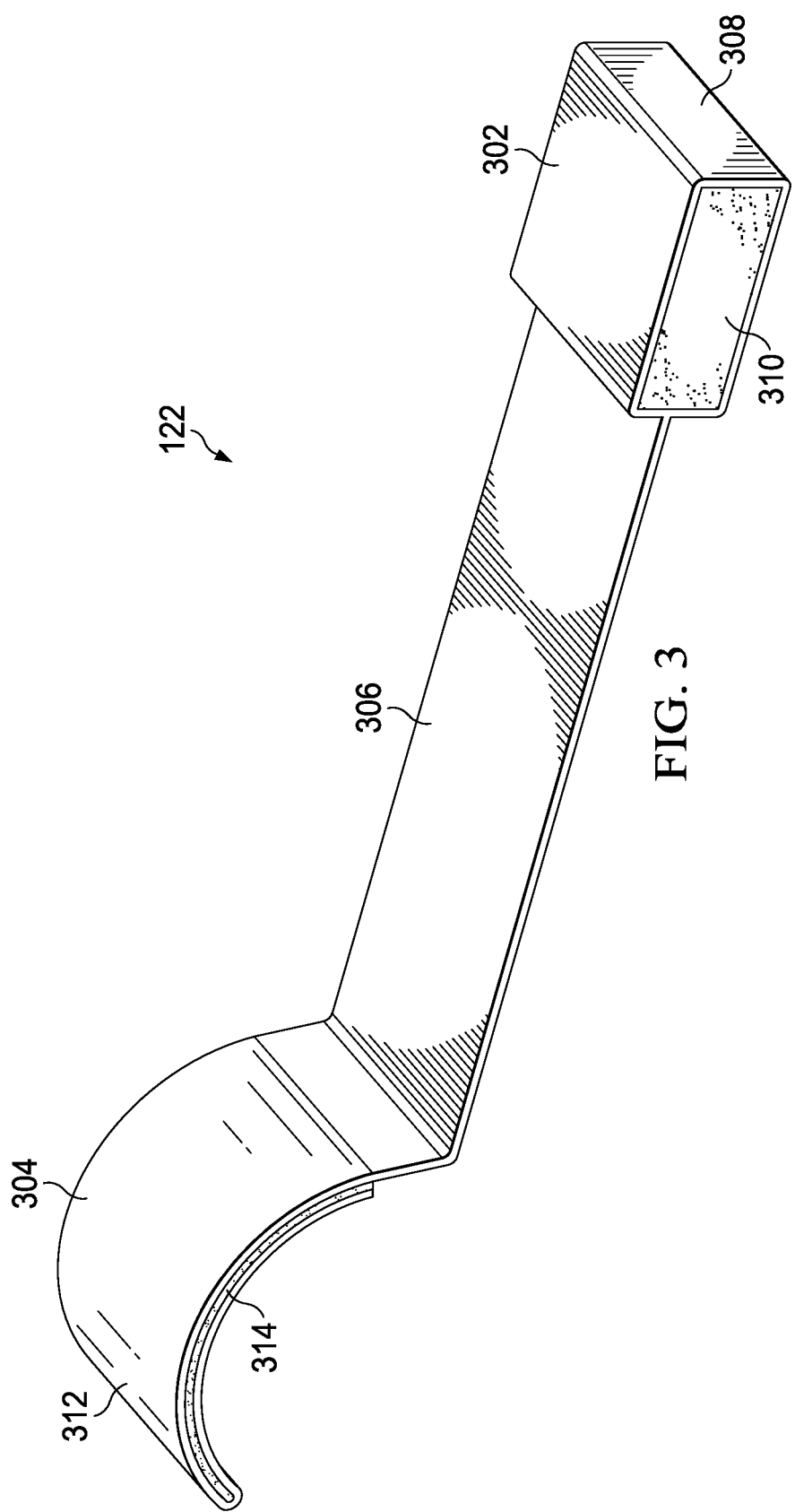
FIG. 3 illustrates a side perspective view of example heat-rejecting media in accordance with embodiments of the present disclosure.

FIG. 3 illustrates a side perspective view of example heat-rejecting media 122 in accordance with embodiments of the present disclosure. As shown in FIG. 3, heat-rejecting media 122 may include a source 302 thermally coupled to a sink 304 via a thermally-conductive strip 306.

Source 302 may be configured to mechanically and thermally couple to a heat-generating component (e.g., a PMIC of an SSD), and may comprise a skin 308 constructed from flexible, thermally-conductive material (e.g., thin layer of graphite, such as a thickness of 0.1 mm), with a cavity formed within skin 308, such cavity including a solid, flexible foam 310. The use of flexible skin 308 and flexible foam 310 in source 302 may allow source 302 to be compressed between top PCB 202 and bottom PCB 204, providing mechanical pressure to ensure thermal coupling of source 302 to a heat-generating component of device 116.

Sink 304 may be configured to mechanically and thermally couple to one or more structures of device 116 (e.g., top cover 202 or other structure), and may comprise a skin 312 constructed from flexible, thermally-conductive material (e.g., thin layer of graphite, such as a thickness of 0.1 mm), with a cavity formed within skin 312, such cavity including a solid, flexible foam 314. The use of flexible skin 312 and flexible foam 314 in sink 304 may allow sink 304 to be compressed between components of device 116 (e.g., top PCB 202, bottom PCB 204, and/or other components of device 116) providing mechanical pressure to ensure thermal coupling of sink 304 to such components.

Strip 306 may comprise a strip of thermally-conductive material (e.g., thin layer of graphite, such as a thickness of 0.1 mm). In some embodiments, strip 306 may be coated with thermally-insulating material, to maximize heat transfer from source 302 to sink 304 via strip 306.

In some embodiments, skin 308, skin 312, and strip 306 may be formed from the same continuous piece of material (e.g., graphite sheet or strip), with skin 308 wrapped around foam 310 and skin 312 wrapped around foam 314.

The thin profile of heat-rejecting media 122 may make its use advantageous within a dual-PCB structure, such as that shown in FIG. 2, as it may allow heat-rejecting media 122 to traverse the narrow space that may be present between top PCB 202 and bottom PCB 204 in order to transfer heat from a location internal to such narrow space to an edge of or the exterior of device 116 (where, in some embodiments, such heat may further be transferred to air flowing proximate to device 116).

In some embodiments, source 302, sink 304, and/or strip 306 may be shaped to contour to specific features within device 116. For example, as shown in FIG. 3, source 302 may have a cubic shape to facilitate optimal thermal coupling between source 302 and a heat-generating component of device 116. As another example, sink 304 and/or a portion of strip 306 may have curves and/or bends to facilitate contouring of heat-rejecting media 122 to components of device 116 (e.g., a barrel capacitor, as shown in other figures described below). However, such shapes of source 302, sink 304, and strip 306 may not be limited to those depicted in FIG. 3, and may vary between implementations of device 116.

Figure 4:
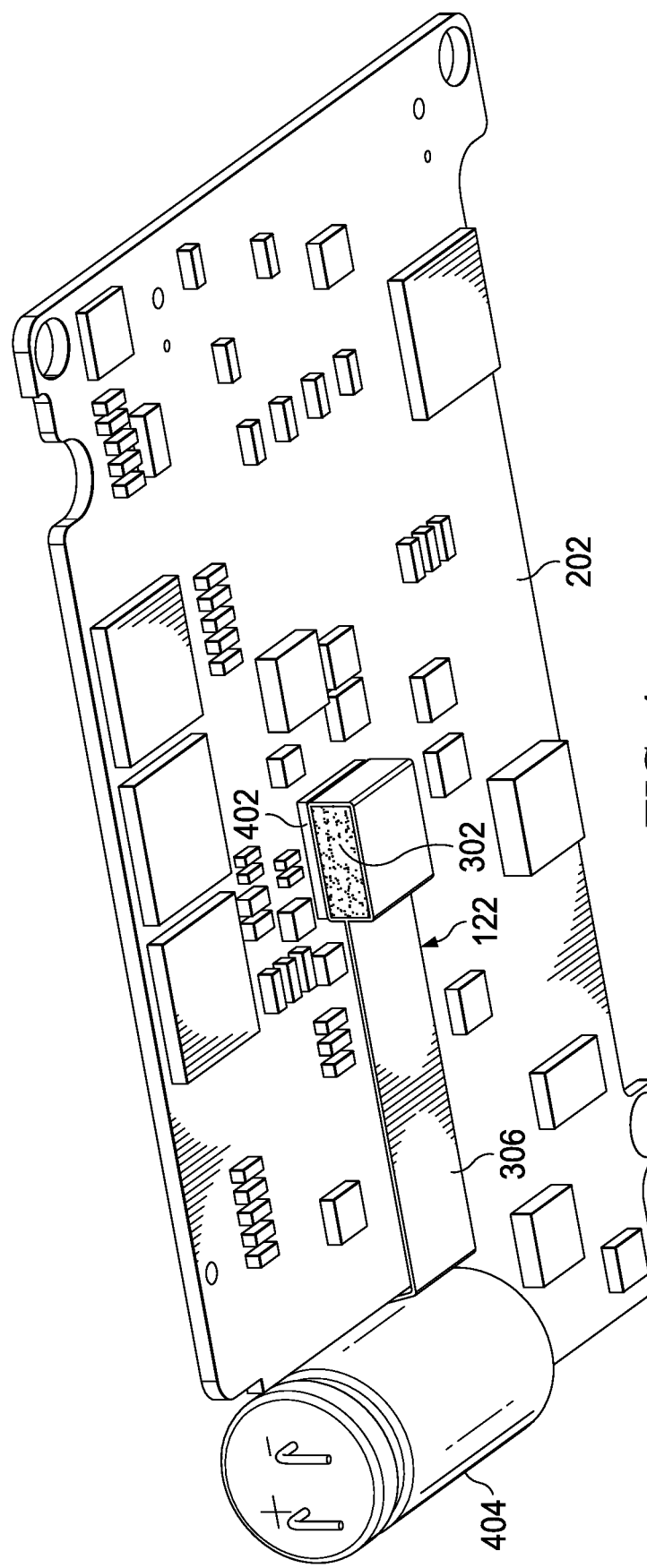
FIG. 4 illustrates a view of the bottom of a top PCB of the device depicted in FIG. 2, in accordance with embodiments of the present disclosure.
Figure 5:
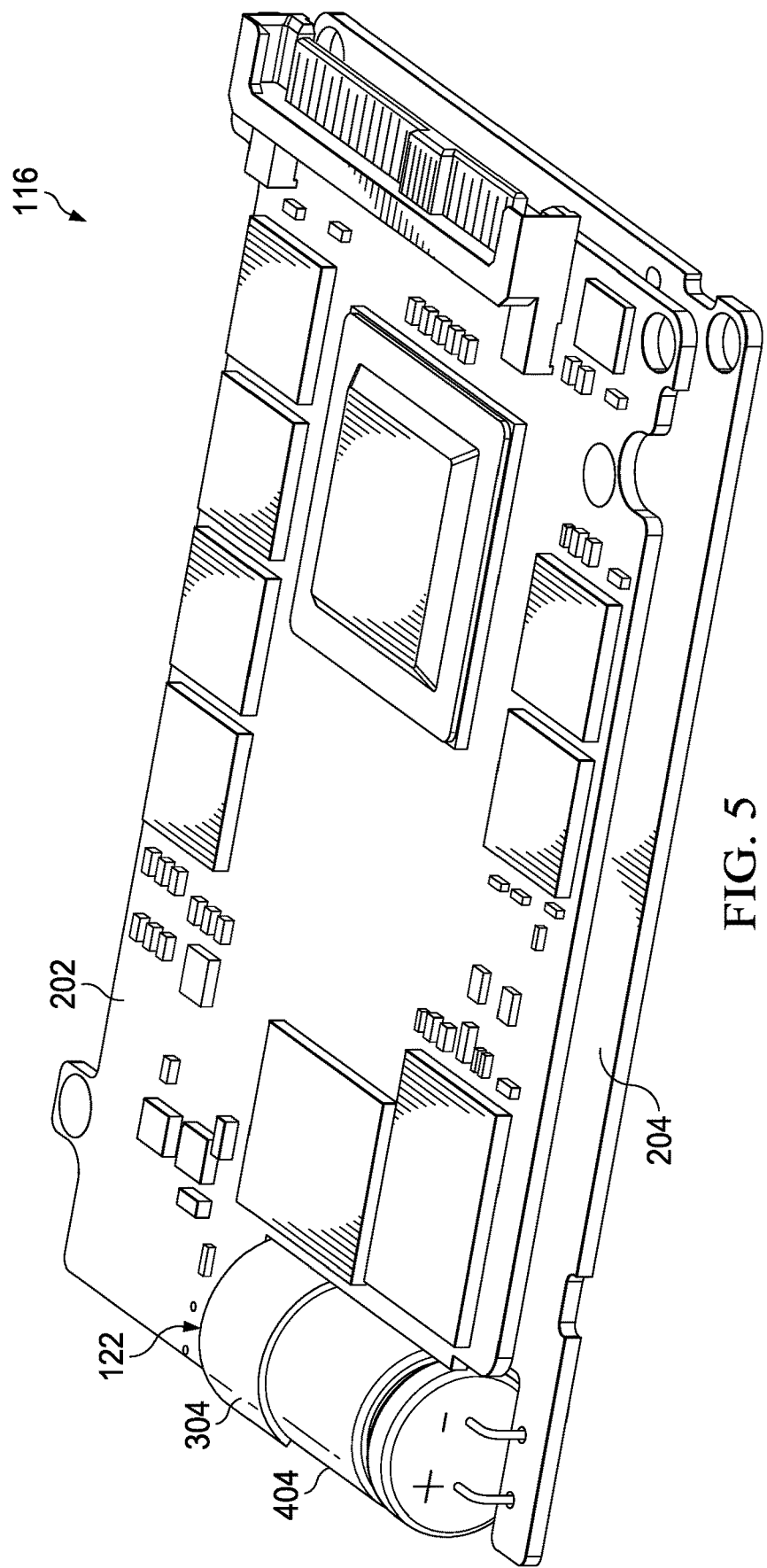
FIG. 5 illustrates an isometric perspective view of the device depicted in FIG. 2 assembled but with its enclosure removed, in accordance with embodiments of the present disclosure.
Figure 6:
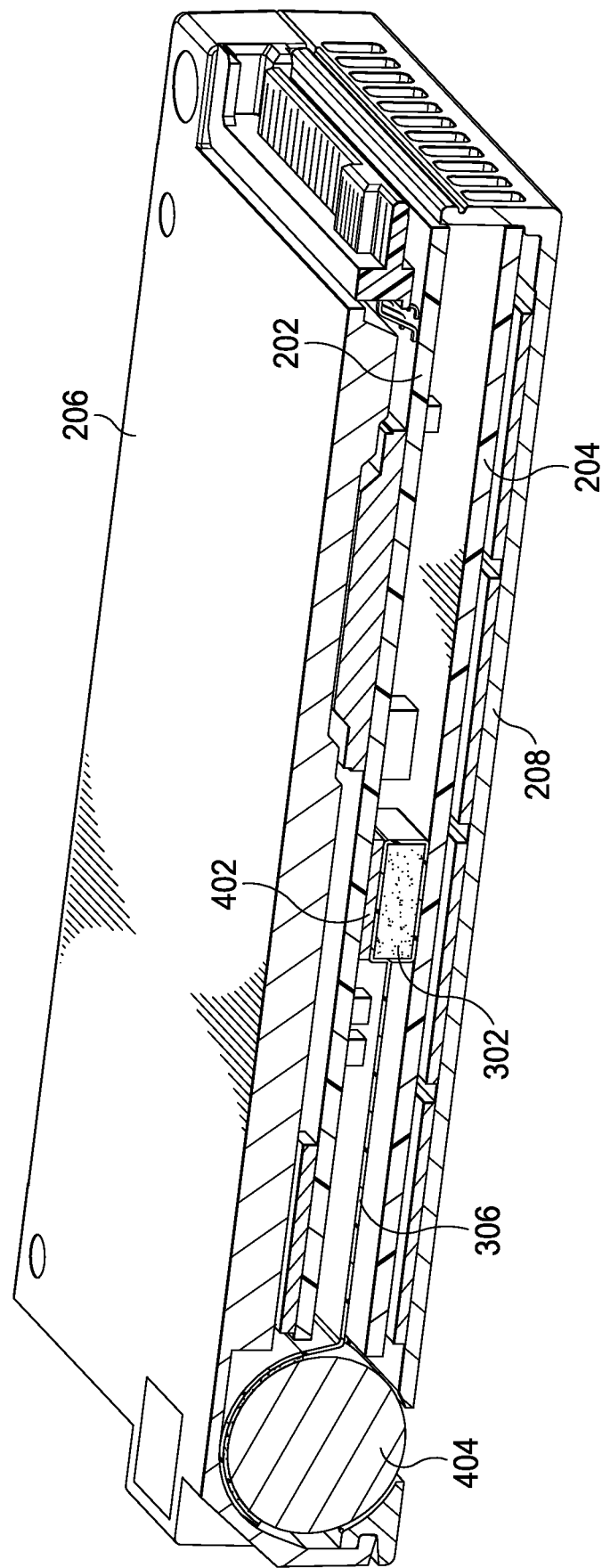
FIG. 6 illustrates a side view of the device depicted in FIG. 2 assembled, in accordance with embodiments of the present disclosure.

FIG. 4 illustrates a view of the bottom of top PCB 202, in accordance with embodiments of the present disclosure. FIG. 5 illustrates an isometric perspective view of device 116, assembled but with its enclosure removed, in accordance with embodiments of the present disclosure. FIG. 6 illustrates a side view of device 116 assembled, in accordance with embodiments of the present disclosure.

As shown in FIGS. 4 and 6, top PCB 202 may have a heat-generating component 402 (e.g., PMIC) mounted thereto. As also shown in FIGS. 4 and 6, source 302 may be thermally coupled to heat-generating component 402 and strip 306 may be routed between the space between top PCB 202 and bottom PCB 204. In some embodiments, a compressive force of source 302 between top PCB 202 and bottom PCB 204 may provide mechanical force for thermally coupling source 302 to heat-generating component 402.

As shown in FIGS. 4-6, strip 306 may terminate into sink 304 at an edge of top PCB 202. Further, strip 306 and/or sink 304 may be shaped to contour to one or more components or features of device 116, such as barrel capacitor 404. In some embodiments, a compressive force of sink 304 between top cover 206 and barrel capacitor 404 may provide mechanical force for thermally coupling sink 304 to capacitor 404 and/or top cover 206. Accordingly, heat may be transferred from heat-generating component 402 to top cover 206, barrel capacitor 404, and/or another component at or near the exterior of device 116, where such heat may be transferred to air flow proximate to device 116.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a processor; and
   an information handling resource communicatively coupled to the processor, the information handling resource comprising:
      a heat-generating component; and
      heat-rejecting media thermally coupled to the information handling resource, the heat-rejecting media comprising:
         a source comprising a first flexible and thermally-conductive skin surrounding a first cavity comprising a first solid foam, such that mechanical compression by components of the information handling resource provides mechanical pressure for thermally coupling the source to the heat-generating component;
         a sink comprising a second flexible and thermally-conductive skin surrounding a second cavity comprising a second solid foam, such that mechanical compression by components of the information handling resource provides mechanical pressure for thermally coupling the sink to a component of the information handling resource exposed externally to the information handling resource; and
         a thermally-conductive strip thermally coupled between the source and the sink.

2. The information handling system of claim 1, wherein the information handling resource comprises a solid state drive.

3. The information handling system of claim 2, wherein the heat-generating component comprises a power management integrated circuit of the solid state drive.

4. The information handling system of claim 1, wherein:
   the information handling resource is implemented at least in part by a first printed circuit board and a second printed circuit board;
   the heat-generating component is mounted on one of the first printed circuit board and the second printed circuit board; and
   mechanical compression between the first printed circuit board and the second printed circuit board of the information handling resource provides mechanical pressure for thermally coupling the source to the heat-generating component.

5. The information handling system of claim 1, wherein at least one of the first flexible and thermally-conductive skin, the second flexible and thermally-conductive skin, and the thermally-conductive strip are formed from graphite.

6. The information handling system of claim 1, wherein the first flexible and thermally-conductive skin, the second flexible and thermally-conductive skin, and the thermally-conductive strip are formed from the same sheet of material.

7. Heat-rejecting media configured to thermally couple to a heat-generating component of an information handling resource, the heat-rejecting media comprising:
   a source comprising a first flexible and thermally-conductive skin surrounding a first cavity comprising a first solid foam, such that mechanical compression by components of the information handling resource provides mechanical pressure for thermally coupling the source to the heat-generating component of the information handling resource;
   a sink comprising a second flexible and thermally-conductive skin surrounding a second cavity comprising a second solid foam, such that mechanical compression by components of the information handling resource provides mechanical pressure for thermally coupling the sink to a component of the information handling resource exposed externally to the information handling resource; and
   a thermally-conductive strip thermally coupled between the source and the sink.

8. The heat-rejecting media of claim 7, wherein the information handling resource comprises a solid state drive.

9. The heat-rejecting media of claim 8, wherein the heat-generating component comprises a power management integrated circuit of the solid state drive.

10. The heat-rejecting media of claim 7, wherein:
    the information handling resource is implemented at least in part by a first printed circuit board and a second printed circuit board;
    the heat-generating component is mounted on one of the first printed circuit board and the second printed circuit board; and
    mechanical compression between the first printed circuit board and the second printed circuit board of the information handling resource provides mechanical pressure for thermally coupling the source to the heat-generating component.

11. The heat-rejecting media of claim 7, wherein at least one of the first flexible and thermally-conductive skin, the second flexible and thermally-conductive skin, and the thermally-conductive strip are formed from graphite.

12. The heat-rejecting media of claim 7, wherein the first flexible and thermally-conductive skin, the second flexible and thermally-conductive skin, and the thermally-conductive strip are formed from the same sheet of material.

13. An information handling resource comprising:
    a heat-generating component; and
    heat-rejecting media thermally coupled to the information handling resource, the heat-rejecting media comprising:
       a source comprising a first flexible and thermally-conductive skin surrounding a first cavity comprising a first solid foam, such that mechanical compression by components of the information handling resource provides mechanical pressure for thermally coupling the source to the heat-generating component;
       a sink comprising a second flexible and thermally-conductive skin surrounding a second cavity comprising a second solid foam, such that mechanical compression by components of the information handling resource provides mechanical pressure for thermally coupling the sink to a component of the information handling resource exposed externally to the information handling resource; and
       a thermally-conductive strip thermally coupled between the source and the sink.

14. The information handling resource of claim 13, wherein the information handling resource comprises a solid state drive.

15. The information handling resource of claim 14, wherein the heat-generating component comprises a power management integrated circuit of the solid state drive.

16. The information handling resource of claim 13, wherein:
    the information handling resource is implemented at least in part by a first printed circuit board and a second printed circuit board;

the heat-generating component is mounted on one of the first printed circuit board and the second printed circuit board; and mechanical compression between the first printed circuit board and the second printed circuit board of the information handling resource provides mechanical pressure for thermally coupling the source to the heat-generating component.

17. The information handling resource of claim 13, wherein at least one of the first flexible and thermally-conductive skin, the second flexible and thermally-conductive skin, and the thermally-conductive strip are formed from graphite.

18. The information handling resource of claim 13, wherein the first flexible and thermally-conductive skin, the second flexible and thermally-conductive skin, and the thermally-conductive strip are formed from the same sheet of material.

* * * * *